United States Patent [19]

Shevchuk

[11] Patent Number: 4,509,647
[45] Date of Patent: Apr. 9, 1985

[54] UNITARY CONSTRUCTION CIRCUIT PACK CARRIER

[75] Inventor: George J. Shevchuk, Old Bridge, N.J.

[73] Assignee: Bell Telephone Laboratories, Inc., Murray Hill, N.J.

[21] Appl. No.: 404,452

[22] Filed: Aug. 2, 1982

[51] Int. Cl.³ .............................................. A47G 19/08
[52] U.S. Cl. ........................................ 211/41; 361/415
[58] Field of Search ...................... 211/41, 40; 361/415

[56] References Cited

U.S. PATENT DOCUMENTS 3,696,936 10/1972 Straccia et al. ........................ 211/41
3,714,513 1/1973 Marconi .............................. 211/41 X
4,277,120 7/1981 Drake et al. ...................... 361/415 X

FOREIGN PATENT DOCUMENTS 2065378 6/1981 United Kingdom ................ 361/415

Primary Examiner—William H. Schultz
Assistant Examiner—Blair M. Johnson
Attorney, Agent, or Firm—Frederick B. Luludis

[57] ABSTRACT

There is disclosed a circuit pack carrier molded as a single structure having an ample draft angle between the circuit pack guides to facilitate removal of the circuit pack carrier from the mold. The guides are cantilevered from the front and arranged into groups and a backplane board connected to molded alignment pins brings the circuit pack guides into parallel alignment. A slight inward flexure of the circuit pack guides is created for firmly gripping and holding in place inserted circuit packs. The unitary constructed carrier has special molded-in side wall channels for easily mounting the carrier to a frame or cabinet.

16 Claims, 4 Drawing Figures

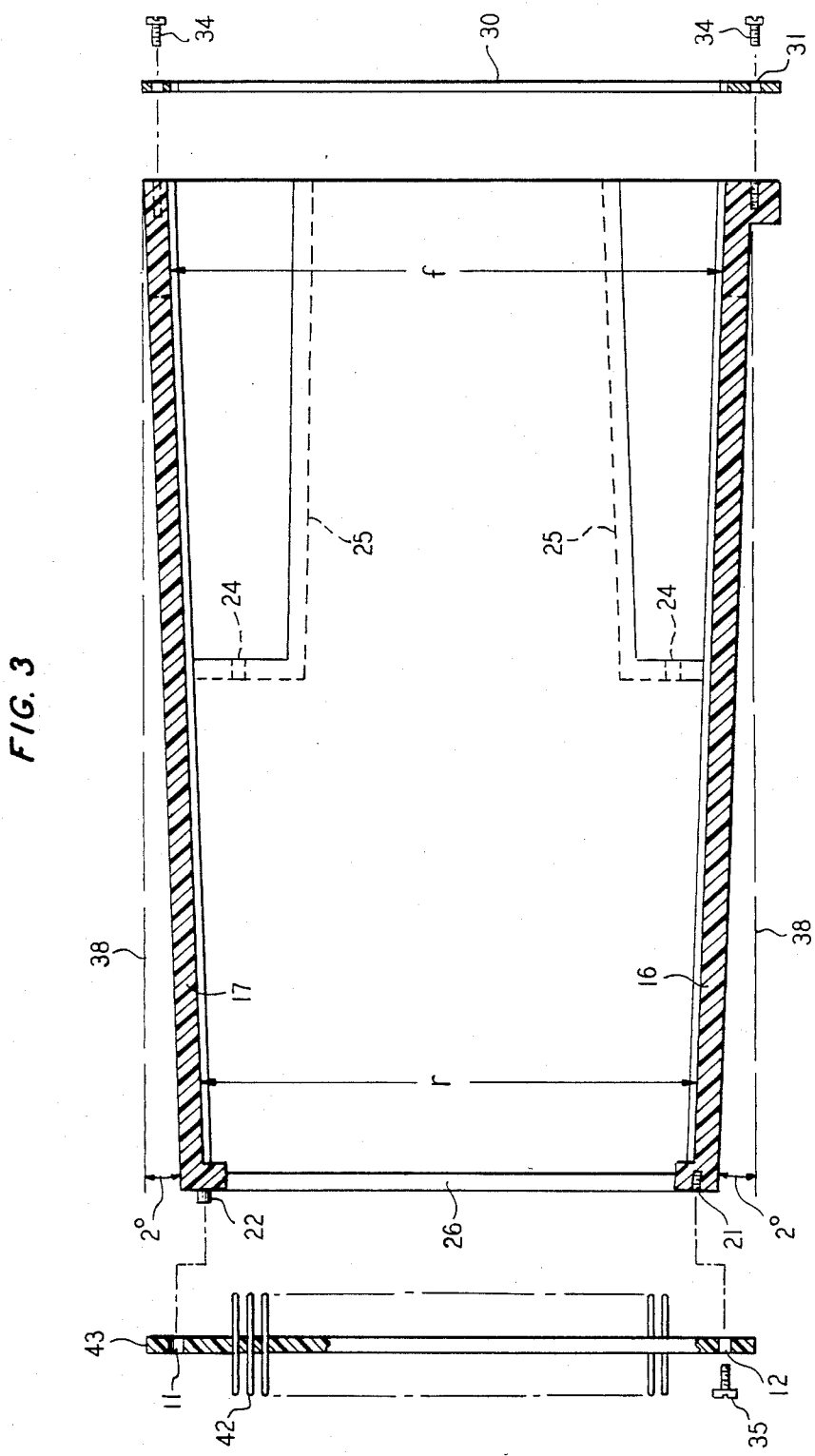

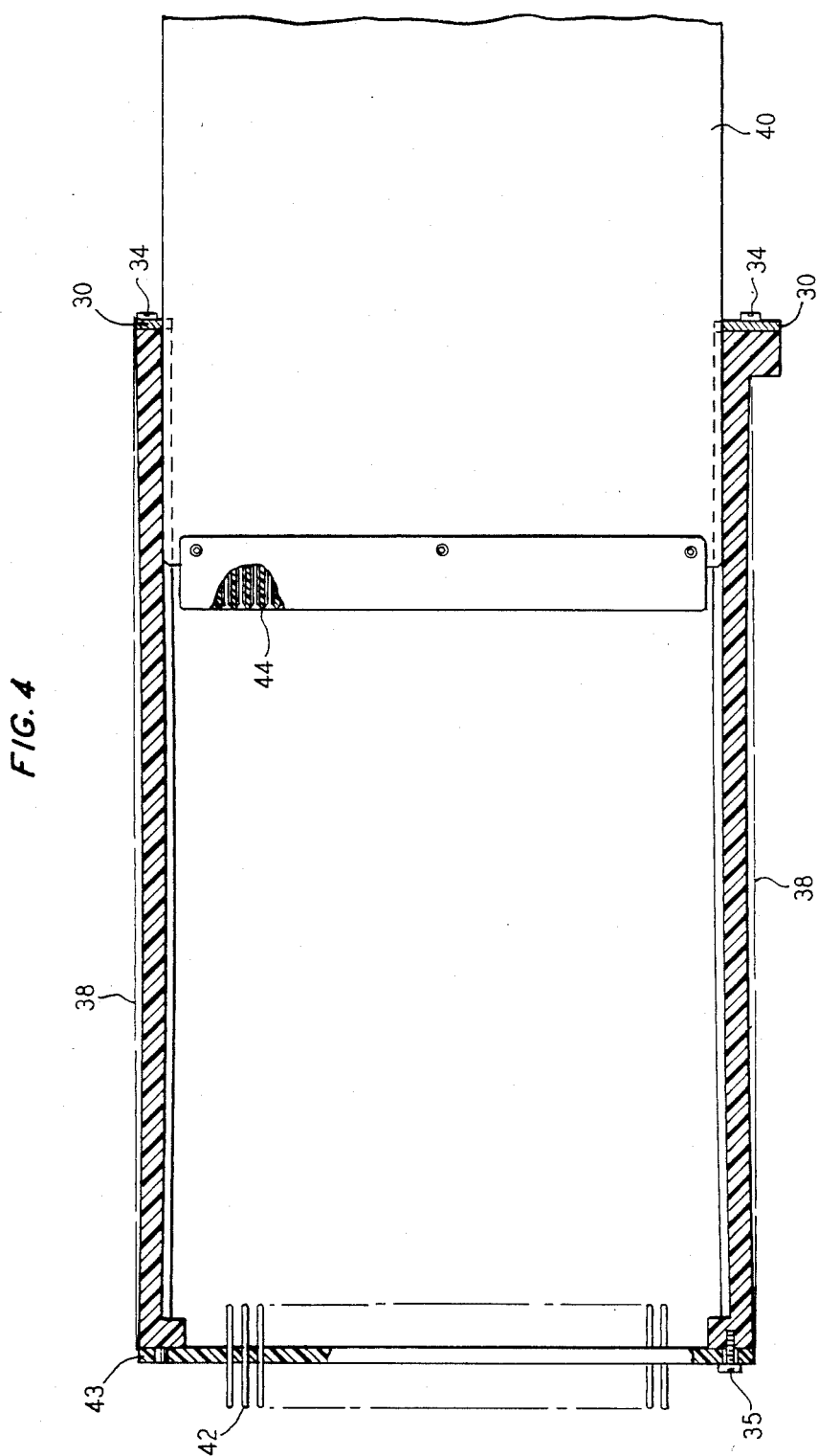

UNITARY CONSTRUCTION CIRCUIT PACK CARRIER

BACKGROUND OF THE INVENTION

This invention relates to a circuit pack housing and more particularly to a circuit pack housing which can be molded as a unitary structure using straight pull tooling and requiring no post molding machining.

The circuit pack housing has become an indispensable part of electrical and electronic circuits. Heretofore, the circuit pack housing or carrier was cast in metal from a sand casting or was assembled from machined parts. A metal circuit pack housing, while having the attributes of strength and durability, is quite expensive to manufacture as compared to the individual circuit packs that are housed in the housing. As such, more attention has focused on developing a less expensive circuit pack housing fabricated from a plastic material.

Priorly, attempts have been made to mold a plastic circuit pack housing as a unitary structure. However, these attempts have not been successful due to shrinkage of the plastic piece part upon cooling in the mold. The shrinkage of the plastic increases the frictional force between the mold and plastic making it difficult to remove the piece part from the mold. Removal of the plastic piece part from the mold under these conditions generally causes damage to the piece part.

Collapsible molds have been designed to separate the mold from the plastic after sufficient cooling has occurred to facilitate removal of the molded part from the mold. However, the cost of designing and manufacturing a collapsible mold is expensive as compared to the cost of designing and manufacturing a non-collapsible mold.

Molding separate identical piece part halves and then assembling the halves to form a housing is still another method of avoiding the problems associated with molding a circuit pack housing. This technique is essentially disclosed in U.S. Pat. No. 4,232,356, issued to Michael A. Saunders, et al, on Nov. 4, 1980. The Saunders patent discloses a circuit pack housing assembled from identical halves. While this method avoids some of the problems discussed above, it is an expensive alternative due to costs of molding and assembling the unit.

it is desirable to take advantage of straight-pull tooling to mold plastic piece parts, such as a unitary constructed circuit pack carrier. Straight-pull tooling is simple to design and is highly reliable since it has no moving parts, other than the mating of the cavity and core.

Presently, molded piece parts are designed to taper in the direction of removal from the straight-pull tooling to reduce the drag between the molded part and tooling. This principle is referenced in the Plastics Products Design Engineering Handbook by Levy and Dubois, published by Van Nostrand Reinhold Company, 1977, and could be applied to mold a unitary circuit pack carrier. However, a circuit pack carrier configured in this manner would not be suitable for housing circuit packs since the vertical spacing between the front and rear of the carrier would vary due to the required taper. As such, circuit packs lodged in the carrier would fit loosely between the non-parallel circuit pack guides at the front of the carrier and therefore, would be responsive to vibration. Over a period of time, vibration would tend to interrupt the electrical connection between a circuit pack and the corresponding backplane wiring.

A circuit pack carrier must be held within close tolerance for proper alignment of the circuit pack connector and corresponding prespaced backplane terminals. This is especially true for a large circuit pack carrier where, for proper alignment of connector and backplane terminals final tolerances must be held to within 5 mils. However, in the art of molding, commonly a tolerance of one mil per inch can be achieved. An objective of one mil per inch applied to a large circuit pack carrier, fifteen to twenty inches in width, would result in a tolerance of fifteen to twenty mils. As such, some of the circuit packs would not properly mate with the corresponding backplane terminals.

SUMMARY OF THE INVENTION

I have solved the aforementioned problems associated with molding a unitary plastic circuit pack housing or carrier in an inexpensive non-collapsible type mold which requires no post molding machining. My invention provides an ample draft angle between the front and rear edges of the circuit pack guides to facilitate removal of the unitary plastic housing from the mold. Alignment pins molded into the circuit pack guide rails bring the circuit pack guides into vertical alignment upon being assembled with a backplane wiring board. After backplane assembly the guides remain flexed slightly inward for holding inserted circuit packs in place. Also, the far or back edges of the circuit pack guides are grouped into sections to allow lateral movement of the guides and to maintain an overall design tolerance of five mils when mated with a precision drilled backplane board.

Transverse channel sections of uniform wall thickness and having a centrally located aperture are also molded into the side walls of the housing for fastening the housing to a cabinet frame. The side wall channels are designed in a manner which does not impede removal of a molded unitary carrier from the tooling upon cooling.

A face plate or frame can be fastened to the face or front of the carrier housing for stiffening the housing, for aligning circuit packs with circuit pack guides and for the placement of designation strips to identify the location of each guide or circuit pack.

BRIEF DESCRIPTION OF THE DRAWING

My invention is shown in the figures in which:

FIG. 3 is a sectional view of the carrier and detached back plane board and detached front frame, and FIG. 4 is a sectional view of an assembled carrier and partially inserted circuit pack.

DETAILED DESCRIPTION

Figure 1:
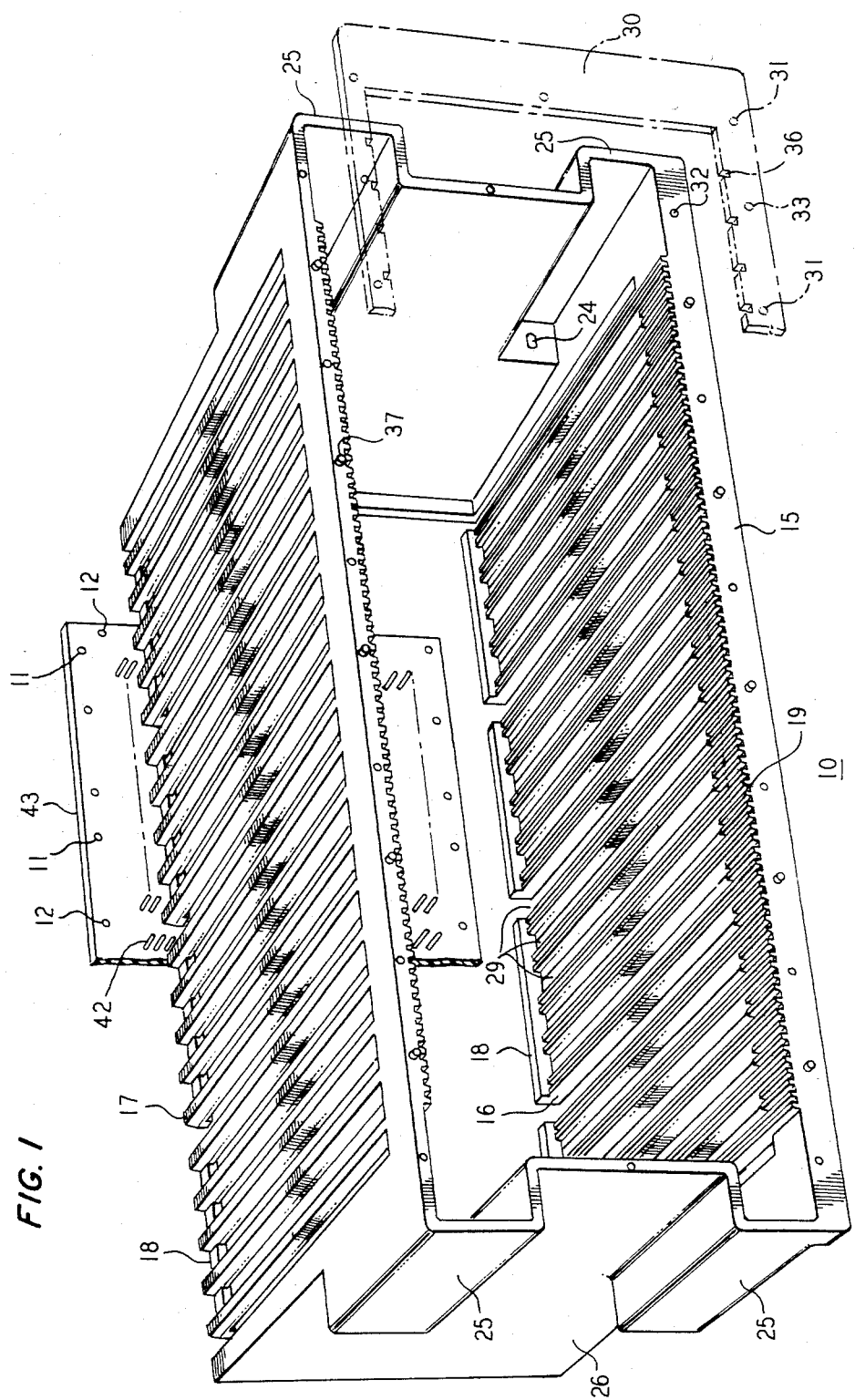
FIG. 1 shows a perspective view of my invention and includes partial perspective views of a detached back plane board and a front frame.

Referring to FIG. 1, the circuit pack carrier or housing 10 is designed to be molded as a one-piece unit using simple straight-pull tooling (not shown). An example of such a tool is shown in Plastics Products Design Engineering Handbook, p. 148, referred to above. When closed, the core portion of the tool occupies the inside of the carrier and the cavity portion of the tool encloses the outside of the carrier. The top and bottom surfaces of the core, which separates from the cavity for removal of the carrier, are designed to form ribs which run the full length of the core for producing corresponding carrier grooves 19.

The cavity portion of the tooling is designed to have selectively located sections which run nearly the length of the cavity and mate with selected ribs formed on the core for producing spaces 29 between adjacent guides (FIG. 1). The spacing 29 extends approximately one and one-half inches from the front 15 of housing 10 to rear rails 18 leaving only short corresponding top and bottom unused grooves or shoulders at the face 15 of housing 10.

In the locations where the cavity sections are omitted, full length top 17, and bottom 16 circuit pack guides with grooves 19 are formed. Guides 16, 17 can be formed or deleted at any housing 10 lateral location by the location or deletion of cavity sections. For purposes of discussion the near end (FIG. 1) of the guide is called front while the far end is called back.

Since the carrier is constructed from surfaces which run perpendicular to the parting line of the mold pulling the molded carrier against the surfaces for removal will result in drag that will damage the carrier. To alleviate this problem, the top and bottom surfaces defined by top and bottom guides 17, 16 and sides 23 of carrier 10 are angled slightly in the direction of removal to allow easy straight pulling of carrier 10 from the tooling. This taper is generally referred to as draft.

In my preferred embodiment, an angle of approximately 2 degrees has been selected for the top and bottom guides. This in turn produces top and bottom guide pairs 17, 16 which are approximately fourteen inches in length from front to back and in which the front and rear vertical spacing (f, r) between guide pairs 16, 17 (FIG. 3) is less at the rear of carrier 10 (r) then at the front 15 of carrier 10 (f).

Briefly referring to FIG. 3, the reduction in vertical spacing between guide pairs 16, 17 from the front to the rear of carrier 10 defines a slope or draft angle of approximately four degrees (two degrees on top and two degrees on bottom) with respect to each other for facilitating removal of carrier 10 from the mold upon cooling. Of course, it is obvious from this disclosure that other draft angles could be selected which would be within the scope of this invention.

As shown in FIG. 1, the rear edges of guides 16, 17 are not attached to sides 23 of carrier 10, but are formed to cantilever from the front 15 (FIG. 1) of carrier 10. This free floating feature facilitates positioning of top 17 and bottom 16 guides in order to bring the guides into parallel alignment. In this manner each group of guides independently can move laterally or vertically for proper registration with backplane wiring board 43 without incurring damage.

Top and bottom guide rails 17, 16 are grouped into parallel sections by cross members 18. This feature ensures accurate lateral location of guide grooves 19 with respect to backplane 43 for proper electrical registration of an inserted circuit pack with backplane wiring board 43.

As discussed, for a molded plastic carrier having a lateral dimension of approximately two feet, accurate location of guide grooves 19 across the entire width of the carrier would be difficult to attain. However, this problem has been overcome by grouping guides 16, 17 into multiple sections as shown in FIG. 1 with each section free to move laterally or vertically. In this manner, proper registration of guides 16, 17 with backplane 43 is easily maintained to accurate tolerances.

Figure 2:
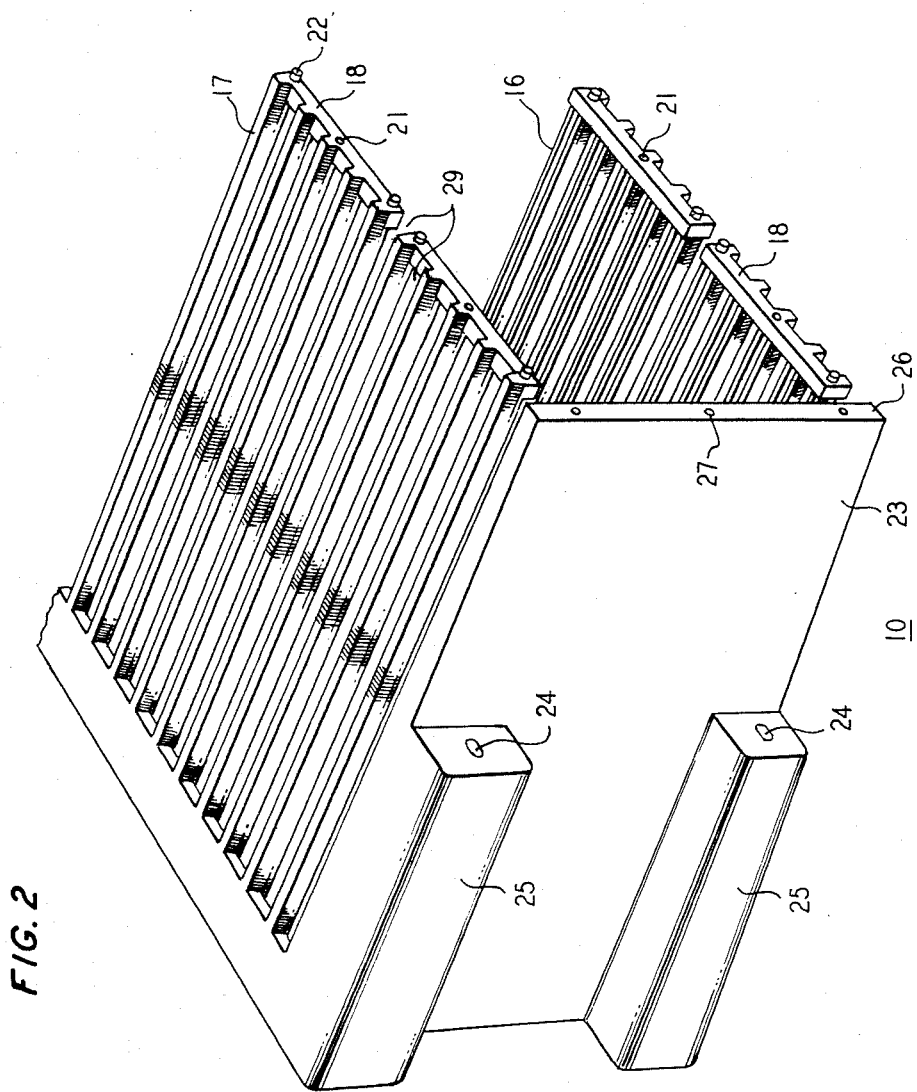
FIG. 2 shows a cut-away rear perspective view of the circuit pack carrier.

Briefly, referring to FIG. 2, each cross member 18 has specially molded alignment pins 22 which register with corresponding apertures 11 in backplane board 43 (FIG. 1). Upon assembly of backplane 43 to carrier 10, the position of each rail section 18 is adjusted until molded-in alignment pins 22 register and mate with corresponding apertures 11 in backplane 43. In this manner the accumulated molded tolerance is eliminated and a lateral tolerance of five mils between the first and last guide rail pairs 16, 17 is met. Registration of alignment pins 22 and backplane apertures 11 also causes the spacing between top and bottom guides 17, 16 at the rear of carrier 10 to be brought to the proper distance.

Referring to FIG. 1, the front vertical spacing of paired top and bottom circuit pack guides 17, 16 is fixed as molded. Guides 16, 17 cantilever front to back and thus when spread apart at the rear of carrier 10 during assembly (guides 16 pulled down—guides 17 pulled up) for mating with backplane wiring board 43, the guides 16, 17 flex inward (down from the top—up from the bottom) thereby gripping a circuit pack, such as circuit pack 40 (FIG. 4), when inserted in the carrier. The pressure exerted by paired guides 16, 17 along the top and bottom edge portions of circuit pack 40 minimizes movement or play of circuit pack 40 due to vibration thereby securing electrical contact between circuit pack 40 and backplane terminals 42 (FIG. 4).

To prevent the bow in guides 16, 17 from exerting excessive pressure along the side edges of circuit pack 40, the vertical spacing between grooves 19 of paired guides 16, 17 at the face 15 of carrier 10 must be slightly greater than at the rear of carrier 10. Circuit pack 40 will, however, be kept properly located at the front of carrier 10 by metal frame 30 which incorporates multiple top and bottom grooves or notches 36 (FIG. 1) that are in alignment with molded in circuit pack guide grooves 19. Accurate registration of frame 30 to carrier 10 is effected by alignment of special molded in carrier frame alignment pins 37 fitted into corresponding frame alignment holes 33. Frame 30 is secured to carrier 10 by fastening thread-forming screws (FIG. 3) through frame holes 31 into pilot holes 32.

As shown in FIG. 1, channel sections 25 are formed by carrier side walls 23. This arrangement allows easy access to mounting bolts which pass through apertures 24 for removing or mounting carrier 10. Channel sections 25 are formed in the manner shown as a means of strengthening carrier side walls 23.

As shown in FIG. 2, top and bottom circuit pack guides 16 and 17 are cantilevered from the front (left) of carrier 10 and are grouped into rail sections 18 for alignment with a backplane wiring board, such as backplane 43. As discussed above, this feature maintains lateral tolerances across the width of carrier 10 and allows rail sections 18 to be easily moved either laterally or vertically for mating alignment pins 22 with fixed backplane apertures.

The number of top and bottom circuit pack guides 17, 16 grouped to form a rail section can be increased or decreased depending on lateral tolerance constraints. By using precision tooling on the back plane wiring board to hold lateral tolerances within bounds the number of guides 16, 17 grouped to form a rail section can be easily increased, for example, eight guides to a rail section 18. Also, the mold can be modified to vary the width of spaces 29 residing within top and bottom rail sections 18 to increase or decrease the number of top and bottom guide 17, 16 pairs.

Referring to FIG. 2, carrier 10 may be rack mounted between two cabinet vertical frame supports by passing threaded bolts through apertures 24 of carrier channel sections 25 and then into threaded holes contained in the two vertical frame supports (not shown). Carrier 10, with appropriate brackets, may also be easily secured to sliding drawer type mounting arrangements discussed in U.S. Pat. No. 4,232,356.

Referring to FIG. 3, backplane 43 is fastened to carrier 10 by threaded-forming screws 35 passing through backplane holes 12 and then into rear rail pilot holes 21 molded into rail section 18. Backplane 43 is further secured to carrier 10 by passing thread forming screws 35 through holes 12 located along the sides of backplane 43 and then into pilot holes 27 molded into flange 26.

FIG. 4 shows assembled carrier 10 in which the guides are brought into alignment with backplane 43. As shown in FIG. 4 alignment of carrier 10 causes the rear of carrier 10 to almost meet horizontal plane or line 38 and produces a gap between the middle portion of carrier 10 and plane 38 which results in the guides flexing inward for gripping circuit pack 41 when fully inserted into carrier 10. As shown in FIG. 4 the alignment of free floating rail sections 18 ensures accurate electrical engagement of terminals 42 of backplane wiring board 43 and female connectors 44 of circuit pack 41.

Conclusion

It will be obvious to one skilled in the art that the foregoing invention disclosed herein is not limited to the embodiment disclosed in the accompanying drawings and foregoing detailed description, but can be rearranged through the substitution, addition and/or deletion of components and functions without departing from the scope and spirit of the invention.

For example, the arrangement of multiple guide rails 18 shown in FIGS. 1 and 2 can be easily rearranged by combining rail sections 18 to form a single rail section. Also, the number of paired circuit pack guides 16, 17 can be easily increased or decreased by rearrangement of the core and cavity sections of the straight-pull tooling. Further, molded in side wall flanges can be substituted for channel sections 25 for mounting carrier 10 to a frame or cabinet without departing from the scope of the invention disclosed herein.

Still further, a latching arrangement can be easily substituted for the molded in alignment pins 22 for alignment of circuit guide pairs 16, 17 all without departing from the scope of the invention disclosed herein.

What is claimed is:

1. A carrier molded as a unitary structure, said carrier comprising;
    a front member forming an aperture, and
    at least one pair of opposing board edge guides integral with said front member and adapted to receive the edges of circuit boards passing through said aperture, said opposing edge guides being cantilevered from said front member such that the distance between said opposing edge guides is substantially greater at said front member than at the free ends of said opposing edge guides.

2. The invention set forth in claim 1 wherein said carrier further includes changing means for changing the distance between the free ends of said opposing edge guides to a point where said opposing edge guides are substantially parallel with each other.

3. The invention set forth in claim 1 wherein said carrier further includes alignment pins molded into the free ends of said opposing cantilevered edge guides, said alignment pins being insertable into corresponding apertures in a connecting surface, said apertures being arranged on said connecting surface such that the distance between the free ends of said opposing edge guides is changed to a point where said opposing edge guides are substantially parallel with each other.

4. A carrier having formed therein an aperture for receiving slideable boards, said carrier comprising,
    at least one pair of cantilevered opposite board edge guides mutually orthogonal to said aperture, said guides adapted to support the bottom and top edges of a board inserted within said aperture, and wherein said opposite pair of guides have an angle therebetween, and
    means for changing said angle between said cantilevered pair of guides to a point where said pair of guides are substantially parallel with each other when the ends of said cantilevered guides are in registration with a connecting surface,
    said changing means including alignment pins molded into the ends of said cantilevered guides which register with corresponding apertures in said connecting surface for reducing said angle.

5. The invention defined in claim 1 comprising a plurality of opposite guide pairs grouped together with the top guides of each group rigidly interconnected and with the bottom guides of each group rigidly interconnected, said groups being horizontally and vertically free to move with respect to each other.

6. The invention defined in claim 4 wherein said cantilevered pair of guides are adapted to bow inward slightly when said angle is changed.

7. A carrier molded as a unitary structure said carrier comprising;
    a front member forming an aperture, and
    a pair of opposing surfaces integral with said front member and adapted to form opposing paired circuit guide means in order to receive circuit boards passing through said aperture, said surfaces being cantilevered from said front member such that the distance between said opposing surfaces is substantially greater at said front member than at the free ends of said opposing surfaces.

8. The invention set forth in claim 7 wherein said carrier further includes means for changing the distance between the free ends of said opposing surfaces to a point where said opposing surfaces are substantially parallel with each other.

9. The invention set forth in claim 7 wherein said carrier further includes alignment pins molded into the free ends of said opposing surfaces, said alignment pins being insertable into corresponding apertures in a connecting surface, said apertures being arranged on said connecting surface such that the distance between the free ends of said cantilevered opposing surfaces is changed to a point where said opposing surfaces are substantially parallel with each other.

10. A carrier having formed therein an aperture for receiving circuit packs, said carrier comprising,
    a pair of cantilevered opposite surfaces mutually orthogonal to said aperture, said surfaces adapted to form mutually paired circuit guide means, and wherein said surfaces have an angle therebetween, and means for reducing said angle between said cantilevered surfaces to a point where said pair of surfaces are substantially parallel with each other when the ends of said cantilevered surfaces are in registration with a connecting surface, said reducing means including alignment pins molded into the ends of said cntilevered surfaces which register with corresponding apertures in said connecting surface for reducing said angle.

11. The invention defined in claim 10 wherein said guide means are grouped into a plurality of opposite paired cantilevered rail sections mutually orthogonal to said aperture for establishing an acceptable design tolerance between first and last one of said guide means.

12. The invention defined in claim 10 wherein said guide means are adapted to bow inward slightly when said angle is reduced.

13. A circuit board carrier molded as a unitary structure, comprising;
- a front member forming an aperture, and
- a pair of opposing surfaces having formed thereon a plurality of groove forming shoulders, said surfaces being integral with said front member and cantilevered from said front member, said groove forming shoulders being adapted to form opposing paired edge guide means for receiving the edges of circuit boards passing through said aperture, said edge guide means being grouped into a plurality of opposing paired cantilevered sections such that the distance between said opposing paired cantilevered sections is substantially greater at said front member than at the free ends of said opposing paired cantilevered sections.

14. The invention set forth in claim 13 wherein said circuit board carrier further includes means for changing the distance between the free ends of said opposing paired sections to a point where said opposing paired sections are substantially parallel with each other.

15. The invention set forth in claim 13 wherein said carrier further includes alignment pins molded into the free ends of said opposing cantilevered paired sections, said alignment pins being insertable into corresponding apertures in said connecting surface, said apertures being arranged on said connecting surface such that the distance between the free ends of said opposing cantilevered paired sections is changed to a point where said opposing cantilevered paired sections are substantially parallel with each other.

16. A circuit pack carrier having formed therein an aperture for receiving circuit packs, comprising,
- a pair of cantilevered opposite surfaces having formed thereon a plurality of groove forming shoulders, said groove forming shoulders adapted to form mutually paired circuit pack guide means, said guide means being grouped into a plurality of opposite paired cantilevered sections having a draft angle therebetween, and
- alignment means for individually bringing each section of said guide means into parallel alignment in order to reduce said angle when affixed to a backplane wiring board,
- said guide means being adapted to bow inward slightly when said angle is reduced in order to exert pressure against the edges of a circuit pack when inserted into said carrier.

* * * * *